United States Patent [19]

Froncisz et al.

[11] 4,435,680

[45] Mar. 6, 1984

[54] MICROWAVE RESONATOR STRUCTURE

[75] Inventors: Wojciech Froncisz, Krakow, Poland; James S. Hyde, Dousman, Wis.

[73] Assignee: Medical College of Wisconsin, Milwaukee, Wis.

[21] Appl. No.: 361,595

[22] Filed: Mar. 25, 1982

Related U.S. Application Data

[63] Continuation-in-part of Ser. No. 310,231, Oct. 9, 1981.

[51] Int. Cl.[3] .............................................. G01R 33/08

[52] U.S. Cl. ...................................... 324/316; 324/315; 324/318; 333/219

[58] Field of Search ............... 333/219, 222, 227, 235; 334/41, 45; 324/316, 318, 315, 322; 336/178

[56] References Cited

U.S. PATENT DOCUMENTS

| | | | |
|---|---|---|---|
| 2,227,846 | 1/1941 | Rust | 333/222 |
| 2,760,304 | 9/1973 | Cohn . | |
| 2,901,712 | 8/1959 | Hogg . | |
| 2,996,610 | 8/1961 | Relis | 333/235 X |
| 3,358,222 | 12/1967 | Hyde . | |
| 3,551,864 | 12/1970 | Sweeney et al. . | |
| 3,559,043 | 1/1971 | Hyde . | |
| 3,783,419 | 1/1974 | Lafond et al. . | |
| 4,053,856 | 9/1977 | Fisher et al. . | |
| 4,110,715 | 8/1978 | Reindel . | |
| 4,185,252 | 1/1980 | Gerlach . | |
| 4,188,599 | 2/1980 | Papa . | |

OTHER PUBLICATIONS

Mehring et al., *A Slotted Tube Resonator STR for Pulsed ESR and ODMR Experiments,* J. Phys. E.: Sci. Instrum., vol. 13, No. 8, Aug. 1980.

"Split-ring Resonator for Use in Magnetic Resonance from 200–2000 MHz", by W. N. Hardy and L. A. Whitehead, Rev. Sci. Instrum. vol. 52, No. 2, Feb. 1981.

"ESR S-band Microwave Spectrometer for Process Control", by James S. Hyde and Wojciech Froncisz.

*Primary Examiner*—Paul L. Gensler

*Attorney, Agent, or Firm*—Barry E. Sammons

[57] ABSTRACT

A microwave resonator is formed by a cylindrical loop and one or more gaps which extend along its length. The loop is formed from a machineable insulating material and a layer of electrically conductive material is deposited over its surfaces.

1 Claim, 7 Drawing Figures

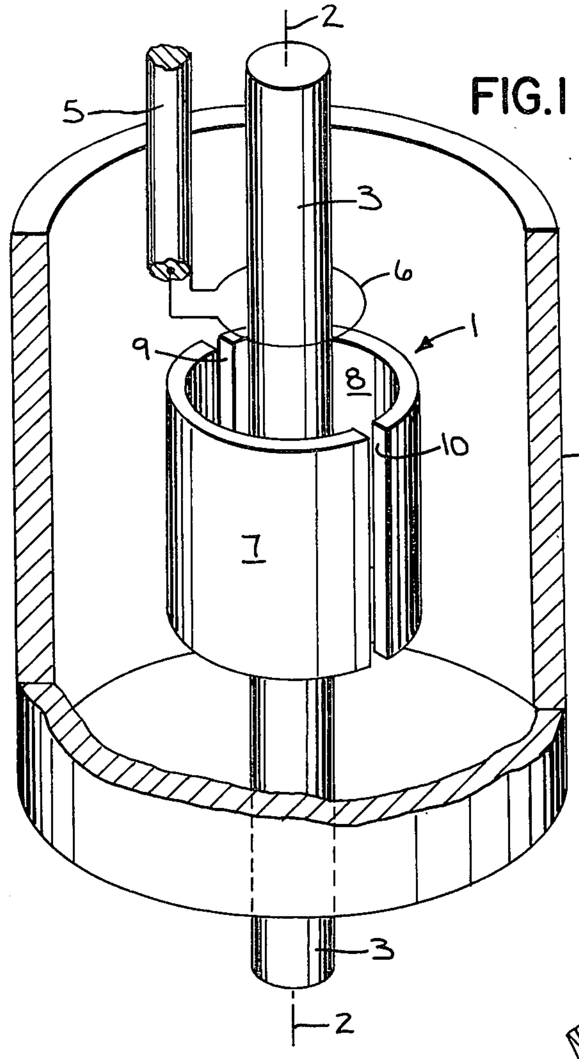
FIG.1
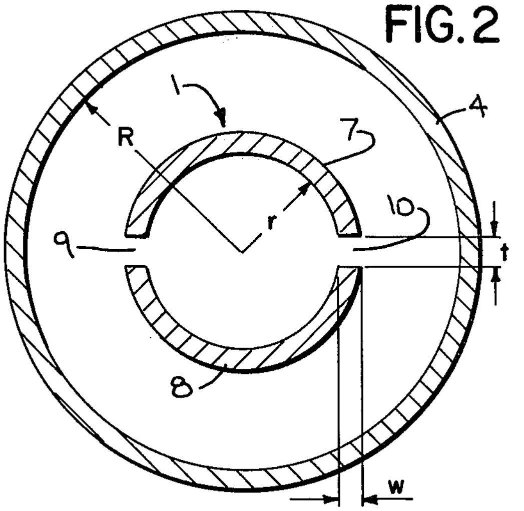
FIG.2
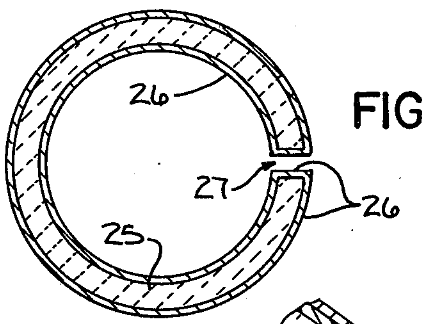
FIG.3
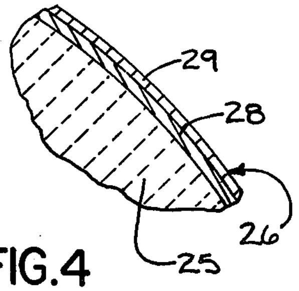
FIG.4
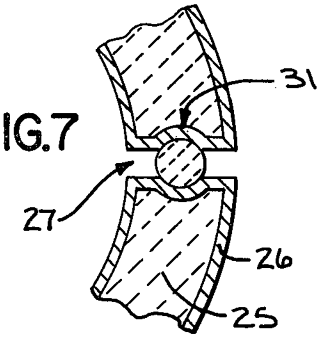
FIG.7
FIG.5
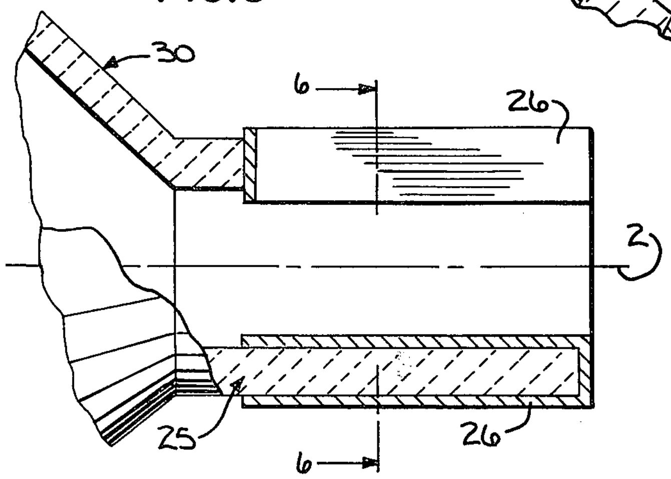
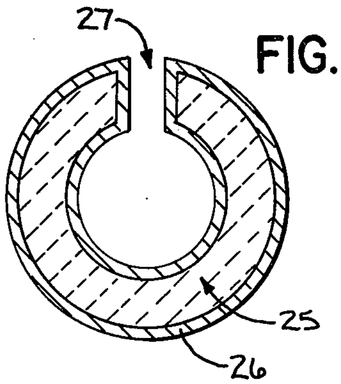
FIG.6

MICROWAVE RESONATOR STRUCTURE

GOVERNMENT RIGHTS

The present invention was made in the course of work under a grant or award from the Department of Health and Human Services. This same invention was also made with Government support under grant No. PCM-23206 awarded by the National Science Foundation. The Government has certain rights in this invention.

RELATED CASES

This application is a continuation-in-part of co-pending U.S. patent application Ser. No. 310,231 filed on Oct. 9, 1981, and entitled "Microwave Resonator".

BACKGROUND OF THE INVENTION

The field of the invention is radio frequency resonators, and particularly, resonators employed in gyromagnetic resonance spectroscopy.

Gyromagnetic resonance spectroscopy is conducted to study nuclei that have a magnetic moment, which is called nuclear magnetic resonance (NMR) and electrons which are in a paramagnetic state which is called paramagnetic resonance (EPR) or electron spin resonance (ESR). There are also a number of other forms of gyromagnetic spectroscopy that are practiced less frequently, but are also included in the field of this invention. In gyromagnetic resonance spectroscopy, a sample to be investigated is subjected to a polarizing magnetic field and one or more radio frequency magnetic fields. The frequency, strength, direction, and modulation of the magnetic fields varies considerably depending upon the phenomena being studied. Apparatus such as that disclosed in U.S. Pat. Nos. 3,358,222 and 3,559,043 has been employed for performing such experiments in laboratories, but widespread commercial use of gyromagnetic resonance spectroscopy techniques has been limited.

The reason for the limited commercial application of gyromagnetic resonance spectrometers is their complexity and high cost. Very high radio frequencies are required for some measurement techniques (such as electron spin resonance measurements, and very strong polarizing magnetic fields are required for others (such as nuclear magnetic resonance). In addition, the physical structures for applying multiple fields to a specimen are complex, particularly when the temperature of the specimen is to be controlled, or the specimen is to be irradiated with light during the measurement.

A split-ring resonator has recently been proposed by W. N. Hardy and L. A. Whitehead for use at radio frequencies between 200 and 2000 MHz. This resonator is characterized by its uncomplicated structure, its high filling factor (magnetic energy stored in the specimen region divided by the total stored magnetic energy) and its small size. Although this proposed structure offers many advantages over prior resonators employed in gyromagnetic resonance spectrometers, it is limited at higher frequencies and it is difficult to properly apply additional magnetic fields to a specimen contained within the split-ring resonator.

SUMMARY OF THE INVENTION

The present invention relates to an improved split-ring resonator construction in which a cylindrical ring is formed from an electrically insulating material, a longitudinal gap is formed in the ring and a layer of electrically conductive material is deposited over the entire surface of the ring.

A general object of the invention is to provide a split-ring resonator which may be precisely machined and is thermally stable. A material which is easy to form and machine and which has a low coefficient of thermal expansion may be employed to form the ring. A number of machineable ceramics possess this quality.

Another object of the invention is to reduce eddy currents which are induced into the resonator by modulating magnetic fields. The modulating magnetic fields easily penetrate the conductive layer, but cannot induce eddy currents in the electrically insulating ring material.

Another object of the invention is to eliminate undesirable effects caused by the interaction of microwaves and readily available insulating materials. By coating all surfaces of the ring with a conductive material, including the surfaces in the longitudinal gap, the ring material is shielded from the microwaves. The dielectric properties of the insulating material used to form the ring are thus of little importance since the microwaves do not penetrate to the insulating material and are not influenced by its properties.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made, therefore, to the claims herein for interpreting the scope of the invention.

BRIEF DESCRIPTION OF THE DRAWINGS

FIG. 1 is a perspective view with parts cut away of a spectrometer system which employs the present invention;

FIG. 2 is a top view of the resonator and surrounding shield which forms part of the system of FIG. 1;

FIG. 3 is a partial top view of a single gap embodiment of the resonator which forms part of the system of FIG. 1;

FIG. 4 is a partial top view of the resonator of FIG. 3;

FIG. 5 is a side elevation view with parts cut away of an alternative embodiment of a resonator which forms part of the system of FIG. 1;

FIG. 6 is a view in cross-section taken along the plane 6—6 indicated in FIG. 5; and FIG. 7 is a partial top of another alternative embodiment of a resonator which forms part of the system of FIG. 1.

DESCRIPTION OF THE PREFERRED EMBODIMENT

Referring particularly to FIGS. 1 and 2, a gyromagnetic resonance spectrometer includes a two-piece, circular cylindrical metal resonator 1 which is aligned along a vertical central axis 2. A tube 3 containing a sample, or specimen, to be tested is inserted through the resonator 1 and a circular cylindrical shield 4 is disposed around the resonator 1. A coaxial cable 5 which connects to a high frequency radio source (not shown in the drawings) has a loop 6 formed at its end, and this loop is positioned adjacent one end of the resonator 1. The electromagnetic field produced by the loop 6 is inductively coupled to the resonator 1, and the degree of coupling can be controlled by adjusting the axial location of the loop 6. A polarizing magnetic field may also be applied to the resulting structure by a large magnet, and field modulation coils may be positioned at locations appropriate for the measurement being conducted. Indeed, it is an important advantage of the present invention that the specimen contained within the tube 3 may be easily subjected to numerous fields of varying strength and orientation in order to implement a wide variety of measurement techniques.

Referring still to FIGS. 1 and 2, the resonator 1 is a lumped circuit cavity resonator which resonates at a radio frequency determined byits geometry. In contrast to distributed circuit cavity resonators, the lumped circuit resonator 1 of the present invention has dimensions which are much less than the wavelength of the radio frequency signal at which it resonates. An additional characteristic of this lumped circuit resonator is that the capacitive and inductive elements are identifiable and the electromagnetic energy oscillates between a magnetic field generated by the inductive element and an electric field generated by the capacitive element.

These characteristics provide a number of advantages. The inductive element in the resonator 1 is the loop, or ring, formed by two metallic pieces 7 and 8, and the capacitive element is the longitudinal gaps 9 and 10 formed at the juncture of the two pieces 7 and 8. The magnitude of the magnetic field produced by the resonator 1 is maximum along the central axis 2, and the electric field which it produces is maximum at the gaps 9 and 10. A specimen which is positioned along the central axis 2, therefore, is subject to a high level magnetic field and a low level electric field. This is a very desirable in gyromagnetic resonant spectroscopy since it is the magnetic field intensity which is required to promote gyromagnetic resonance phenomena. Indeed, it is a characteristic of the resonator 1 that the "filling factor" is very high thus providing a very sensitive measurement instrument. The filling factor is the ratio of total magnetic energy in the space occupied by the specimen divided by the total magnetic energy in the resonator, and the higher the filling factor, the better is the sensitivity.

Although there are many possible variations in the shape and size of the resonator 1 it is particularly suited for radio frequencies in the microwave region of the spectrum. The resonator of the present invention can be constructed to resonate over a very wide range of frequencies, making it applicable not only to a large number of gyromagnetic resonance measurement techniques, but also to microwave communications in general.

As shown particularly in FIG. 2, the basic resonator 1 of the present invention is comprised of a conductive loop formed by two metallic pieces 7 and 8. The pieces 7 and 8 are spaced from one another to form the gaps 9 and 10. The shield 4 surrounds the resonator 1 and its purpose is to suppress electromagnetic radiation to the surroundings and to improve the "Q" of the resonator 1 at the microwave frequencies. This purpose is best served if the radius (R) of the shield 4 is less than one-fourth the wavelength of the resonant frequency. The resonant frequency of the resulting structure is as follows:

$$F = \left[\frac{1}{2\pi}\left(1 + \frac{r^2}{R^2 - (r+w)^2}\right)^{\frac{1}{2}}\left(\frac{t}{\pi w \epsilon \mu}\right)^{\frac{1}{2}}\frac{1}{r}\left(\frac{1}{1 + 2.5\frac{t}{w}}\right)^{\frac{1}{2}}\right] n^{\frac{1}{2}} \qquad (1)$$

where:

$\epsilon$ = the dielectric constant of the material in the gaps 9 and 10;

$\mu$ = the permeability of free space; and n = the number of identical gaps in the conductive loop.

The third term in parentheses takes into account the effect of fringing fields near the gaps 9 and 10 on the capacitance. In the limit where R/r>>1 and t/w<<1, this equation reduces to the following:

$$F = \frac{1}{2\pi}\left(\frac{1}{LC}\right)^{\frac{1}{2}} \qquad (2)$$

$$\text{where: } L = \frac{\mu \pi r^2}{Z}$$

$$\frac{1}{C} = n\frac{t}{\epsilon w Z} \qquad (3)$$

Z = the length of the resonator 1. Note that the length does not affect the resonant frequency.

Table A provides a list of the resonant frequencies and Q of the structure for a number of geometries employing two gaps in the resonator loop.

TABLE A

| F(GHz) | Q | r | w | t | R |
|---|---|---|---|---|---|
| 3.75 | 1500 | .094" | .092" | .004" | .375" |
| 6.77 | 1230 | .099" | .026" | .006" | .20" |
| 9.02 | 1800 | .076" | .014" | .006" | .25" |
| 10.8 | 1080 | .076" | .014" | .006" | .14" |

The resonant frequency of the structure can be increased effectively by increasing the number of gaps in the resonator loop. That is, a substantial change in resonant frequency is achieved by altering the number of capacitive elements in the structure. The resonant frequency is thus controlled by the value of C in the above equation (2), and the value of C can be expressed generally as follows:

$$\frac{1}{C} = \frac{1}{C_1} + \frac{1}{C_2} + \ldots \frac{1}{C_n} \qquad (4)$$

$$\text{where: } \frac{1}{C_n} = \frac{t_n}{\epsilon w_n Z}$$

$t_n$ = gap spacing $w_n$ = gap width

Table B provides a list of the resonant frequencies and Q of a resonator in which the number of gaps (n) is varied.

TABLE B

| n | F(GHz) | Q | r | w | t | R |
|---|---|---|---|---|---|---|
| 1 | 4.42 | 1100 | .099" | .026" | .006" | .200" |
| 2 | 6.77 | 1230 | .099" | .026" | .006" | .200" |
| 4 | 9.79 | 1150 | .099" | .026" | .006" | .200" |

Referring particularly to FIGS. 3 and 4, the resonator according to the present invention is formed by coating a non-conductive base material 25 with a conductive layer 26. The base material 25 is selected for its low coefficient of thermal expansion and its ability to be machined to high tolerance. Several machineable glasses and ceramics are suitable, but a ceramic manufactured by Corning glass under the trademark "Macor" has been used with great success. The base material is formed into a circular cylindrical shape having the desired inside and outside diameters. A single longitudinal cut may be made in the base material 25 to form a single gap 27, or additional cuts may be made as described in the above-cited co-pending patent application. Other machinable materials produced by firing ono-metallic minerals at high temperature may also be employed as the base material.

The entire surface of the base material 25 is coated with a conductive layer. A two-step process is preferred in which a first layer 28 is produced by a chemical deposition of silver using known processes. This process is similar to that used to manufacture mirrors. This is followed by a second layer 29 of silver which is produced by electrochemical deposition. This two-step process has been found to improve the quality factor, Q, of the resulting resonator.

The conductive layer 26 is thick enough to conduct the currents induced by the microwaves. A thickness of approximately ten microwave skin depths accomplishes this purpose and shields the base material 25 from the microwaves. On the other hand, magnetic field modulation commonly used in EPR spectroscopy easily penetrates the conductive layer 26, but the underlying insulating base material 25 will not conduct the eddy currents which might otherwise be induced. Thus the conductive layer 26 is not thick enough to support the conduction of lower frequency eddy currents produced by magnetic field modulation.

Although conductive materials other than silver may be employed to form the layer 26, any metal chosen for this purpose must be free of ferromagnetic and paramagnetic contaminants if the resonator is to be used for magnetic resonance spectroscopy. In addition to silver, aluminum or oxygen free copper may be employed. When copper is employed it should be further plated with a very thin protective coating of a non-corrosive material. Gold or rhodium will serve this purpose and will prevent the formation of paramagnetic copper salts.

Although it is preferable to coat all surfaces of the resonator base sdtructure with a layer of conductive material, it is not essential. Referring particularly to FIG. 5 for example, it is possible to form the resonator base 25 as an integral part of a supporting structure 30. The conductive layer 26 covers only a portion of the exposed surfaces since one end of the cylindrical base 25 is connected to the support 30 and cannot be coated. In such case the base material is selected to have a low dielectric loss and to have minimal paramagnetic contaminants. The supporting structure 30 may be shaped to retain the resonator base 25 in a position along the central axis 2, and reference is made to our co-pending U.S. patent application Ser. No. 361,594 filed on Mar. 25, 1982 and entitled "Modular Lumped circuit Resonator" for a more complete description of such a structure.

Although it is possible to select base materials with very low thermal coefficients of expansion, it has been discovered that stresses generated during the machining of some materials can exaggerate the mechanical effects of temperature changes in the loop-gap resonator. Since the frequency of the loop-gap resonator is directly affected by mechanical changes in the spacing (t) of the longitudinal gap 27, measures must be taken to minimize this problem.

One solution is shown in FIG. 7. Before coating the base material 25, a hole is drilled along the length of the longitudinal gap 27. The base 25 is then coated with a conductive layer 26 as described above, and then a quartz rod 31 is inserted into the hole in the gap 27. The diameter of the rod 31 is selected to open the gap 27 slightly, and to thereby stress the base mateial 25. The quartz rod 31 has a very low thermal coefficient of expansion and it maintains a relatively fixed gap dimension despite variations in the remainder of the structure. It should be apparent that the same result can be achieved without extending the rod 31 along the full length of the gap 27. For example, short pieces of rod 31 may be inserted at each end of the resonator gap 27 to maintain temperature stability.

A number of resonator structures have been disclosed which are particularly suited for gyromagnetic resonance spectrometers. However, it should be apparent to those skilled in the art that the resonator of the present invention also has application to other arts which employ high frequency resonators. In addition, the resonators disclosed herein are circular cylindrical in shape, but other shapes are also possible. Accordingly, the term "loop" as used in the following claims includes all shapes which enclose the central longitudinal axis and which define an opening extending completely through the loop along that axis.

We claim:

1. A lumped circuit resonator for a gyromagnetic resonance spectrometer which resonates when high frequency electromagnetic energy is applied thereto, and which comprises:

a loop formed from an electrically insulating base material which is disposed around a central longitudinal axis, said loop having a gap formed along its entire length which is dimensioned to provide a desired resonant frequency, an electrically conductive layer deposited on the surface of the loop, including the surfaces formed by said gap to shield the base material from the applied high frequency electromagnetic energy, and in which a dielectric rod having a very low thermal coefficient of expansion is inserted in the gap to maintain the dimensions of the gap relatively constant.

* * * * *